United States Patent [19]
Katti et al.

[11] Patent Number: 5,289,410
[45] Date of Patent: Feb. 22, 1994

[54] NON-VOLATILE MAGNETIC RANDOM ACCESS MEMORY

[75] Inventors: Romney R. Katti, Pasadena; Henry L. Stadler, La Canada; Jiin-Chuan Wu, San Gabriel, all of Calif.; Yaochung Chen, Ann Arbor, and Pauab K. Bhattacharya, Ann Arbor, both of Michigan

[73] Assignee: California Institute of Technology, Pasadena, Calif.

[21] Appl. No.: 905,666

[22] Filed: Jun. 29, 1992

[51] Int. Cl.$^5$ .............................................. G11C 11/18
[52] U.S. Cl. .................................... 365/170; 365/173; 365/87
[58] Field of Search ................ 365/171, 87, 2, 9, 173, 365/170

[56] References Cited

U.S. PATENT DOCUMENTS

| | | | |
|---|---|---|---|
| 3,696,349 | 10/1972 | Kaske et al. | 365/171 |
| 4,087,582 | 5/1978 | Shitahata et al. | 365/171 |
| 5,089,991 | 2/1992 | Matthews | 365/9 |
| 5,099,309 | 3/1992 | Kryzaniwsky | 257/720 |
| 5,103,424 | 4/1992 | Wade | 365/189.02 |

*Primary Examiner*—Eugene R. LaRoche
*Assistant Examiner*—Vu A. Le
*Attorney, Agent, or Firm*—Leonard Tachner

[57] ABSTRACT

Improvements are made in a non-volatile magnetic random access memory. Such a memory is comprised of an array of unit cells, each having a Hall-effect sensor and a thin-film magnetic element made of material having an in-plane, uniaxial anisotropy and in-plane, bipolar remanent magnetization states. The Hall-effect sensor is made more sensitive by using a 1 m thick molecular beam epitaxy grown InAs layer on a silicon substrate by employing a GaAs/AlGaAs/InAlAs superlattice buffering layer. One improvement avoids current shunting problems of matrix architecture. Another improvement reduces the required magnetizing current for the micromagnets. Another improvement relates to the use of GaAs technology wherein high electron-mobility GaAs MESFETs provide faster switching times. Still another improvement relates to a method for configuring the invention as a three-dimensional random access memory.

12 Claims, 15 Drawing Sheets

| 1.0 μm | InAs, μ=5,400 cm²/V.s | n type |
|---|---|---|
| 0.2 μm | Insulating AlAs/GaAs superlattice | |
| | (100) SI Substrate | p |

FIG. 4a

| 2.0 μm | InAs, μ=9,400 cm²/V.s | n type |
|---|---|---|
| 0.2 μm | Insulating AlAs/GaAs superlattice | |
| | (100) SI Substrate | p |

FIG. 4b

| 1.0 μm | InAs | n |
|---|---|---|
| 0.5 μm | InAlAs | |
| | AlGaAs/GaAs superlattice | |
| | (100) SI Substrate | p |

FIG. 4c

⊖ Connection Lead

▨ Adhesive Layer

▬ Heat Sink Layer

☐ Memory Chip

⦀⦀⦀⦀ Substrate

NON-VOLATILE MAGNETIC RANDOM ACCESS MEMORY

ORIGIN OF INVENTION

The invention described herein was made in the performance of work under a NASA contract, and is subject to the provisions of Public Law 96-517 (35 USC 202) in which the Contractor has elected to retain title.

TECHNICAL FIELD

The present invention relates to an improved non-volatile random access memory (RAM) and more particularly, to improvements in a RAM utilizing an array of unit cells, each cell realized with a rectangular thin-film magnetic material having an in-plane bipolar remanent magnetization state with a high squareness hysteresis loop, a Hall-effect sensor, and integrated circuitry for incorporating the cells into a matrix of conductors and switching transistors to provide read and write operations. The improvements relate to an increased sensitivity Hall sensor, a current-isolating read-out design, a magnetizing current reduction write design, faster switching using GaAs MESFETs and a method for configuring a three-dimensional magnetic random access memory.

BACKGROUND ART

Ever increasing data processing requirements demand faster and denser random access memory to keep pace with improved CPU speed and throughput. Semiconductor memories such as dynamic RAM and static RAM have very fast access times but are also volatile. Electrically erasable/programmable read only memories (EPROMs) are non-volatile but have very long write times and offer a conflict between refresh needs and radiation tolerance. A ferroelectric RAM (FRAM) offers short read and write access times, but the data retention (non-volatility) and the longevity of the ferroelectric material (reliability) are in question. The magneto-resistive random access memory (MRAM) is non-volatile and has no problem with longevity but has long read access times (on the order of microseconds). None of the existing technologies can satisfy all of the needed data storage requirements. An objective of this invention is to provide an integrated fast access (<100 nsec), non-volatile, radiation hard, high density (>$10^6$ bit/cm$^2$) random access memory for high speed computing sing magnetic material for storage and Hall-effect sensors for reading out data stored.

It is noted that the concept of using magnetic material for a non-volatile RAM has been implemented before, e.g., in core memory, cross-tie memory and the recent magnetic random access memory (MRAM). The Hall effect has also been used since it was discovered in 1879 to detect small magnetic fields. What has not been conceived heretofore are memories which combine magnetic storage with Hall-effect sensing to form what is referred to herein as magnetic-Hall random access memory MHRAM. Recent improvements in InSb, GaAs and In As deposition processing and technology, and recent studies on very small and thin permalloy, CoPt, CoPtO and $\gamma$-Fe$_2$O$_3$ particles, currently make possible the implementation of the novel MHRAM concept for high density, fast access, non-volatile, radiation hard, random access memory.

STATEMENT OF THE INVENTION

In accordance with the present invention, improvements are made in a non-volatile magnetic random access memory. Such a memory is comprised of an array of unit cells, each having a Hall-effect sensor and a thin-film magnetic layer made of material having an in-plane, uniaxial anisotropy and in-plane, bipolar remanent magnetization states. The magnetic layer is positioned with one end near the center of the Hall-effect sensor and is magnetized by a local applied field whose direction is used to form either a "0" or "1" state that is retained until an opposite field is applied to change its state. For example, 60 nm thick 4 $\mu$m by 1 $\mu$m rectangular layer of Permalloy NiFe has a 50 Oe switching field and a remanence of 10,000 Gauss. The information stored in the thin-film magnetic material is detected by passing a sensing current through the Hall-effect sensor which then produces different electric potentials opposite each other on the edges of the sensor parallel to the direction of sensing current flow. The semiconductor material used for the Hall-effect sensor is typically InSb because of its large electron mobility (40,000 cm$^2$/V-s) and Hall coefficient ($8 \times 10^{-4}$ m$^3$/c) and thus short read access times.

The improvements include the following:

(a) The Hall-effect sensor is made more sensitive by using a 1 $\mu$m thick molecular beam epitaxially grown InAs layer on a silicon substrate by employing a GaAs/AlGaAs/InAlAs superlattice buffering layer. This improvement which replaces the aforementioned InSb Hall-effect sensor material, assures a room temperature electron mobility greater than 10,000 cm$^2$/sec-V;

(b) Two embodiments of improved memory cell read-out designs avoid current shunting problems of matrix architecture. Each such embodiment employs transistors to isolate the current leads of each Hall-effect sensor from all of the other Hall-effect sensors in the matrix;

(c) Two embodiments of improved memory cell write designs reduce the required magnetizing current for the micromagnets. One such embodiment employs a "picture frame" conductor and the other employs two metalization layers forming a 2.5 turn coil;

(d) Another disclosed improvement relates to the use of GaAs technology wherein high electron-mobility GaAs MESFETs provide faster switching times;

(e) Still another improvement relates to a method for configuring the invention as a three-dimensional random access memory.

All of the above-noted improvements are implemented using a magnetic material in a manner that is unique as compared to the prior art.

OBJECTS OF THE INVENTION

It is therefore a principal object of the present invention to provide an improved magentic Hall-effect random access memory which utilizes an improved Hall-effect sensor having greater sensitivity.

It is an additional object of the invention to provide an improved magnetic Hall-effect random access memory which utilizes transistors to isolate the current leads of each Hall-effect sensor from all of the other Hall-effect sensors in a matrix of cells.

It is still an additional object of the invention to provide an improved magentic Hall-effect random access memory which utilizes a conductor configuration for reducing the magnetizing current for the micromagnets.

It is still an additional object of the invention to provide an improved magnetic Hall-effect random access memory in which faster switching is achieved by employing GaAs technology.

It is still an additional object of the invention to provide an improved non-volatile random access memory having increased volumetric storage density by providing a three-dimensional packaging configuration.

BRIEF DESCRIPTION OF THE DRAWINGS

The aforementioned objects and advantages of the present invention, as well as additional objects and advantages thereof will be more fully understood hereinafter when taken in conjunction with the accompanying drawings in which:

FIG. 1b illustrates a side view of FIG. 1a taken along a line b—b in FIG. 1a when the magnetic layer is magnetized in one state shown in FIG. 1a;

FIG. 3b is a cross-section taken along a line b—b in FIG. 3a;

FIG. 3c is a cross-section taken along line c—c in FIG. 3a;

FIG. 4, comprising FIGS. 4a, 4b and 4c, illustrates three alternative embodiments of the invention wherein InAs is substituted for InSb using at least one buffer layer;

DETAILED DESCRIPTION OF THE INVENTION

Figure 1C:
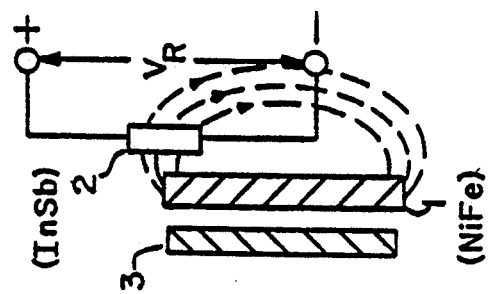
FIG. 1c illustrates the structure of FIG. 1b when the magnetic layer thereof is magnetized in an opposite state from that shown in FIG. 1b.
Figure 1B:
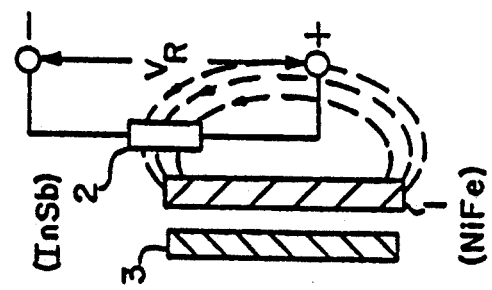
Figure 1A:
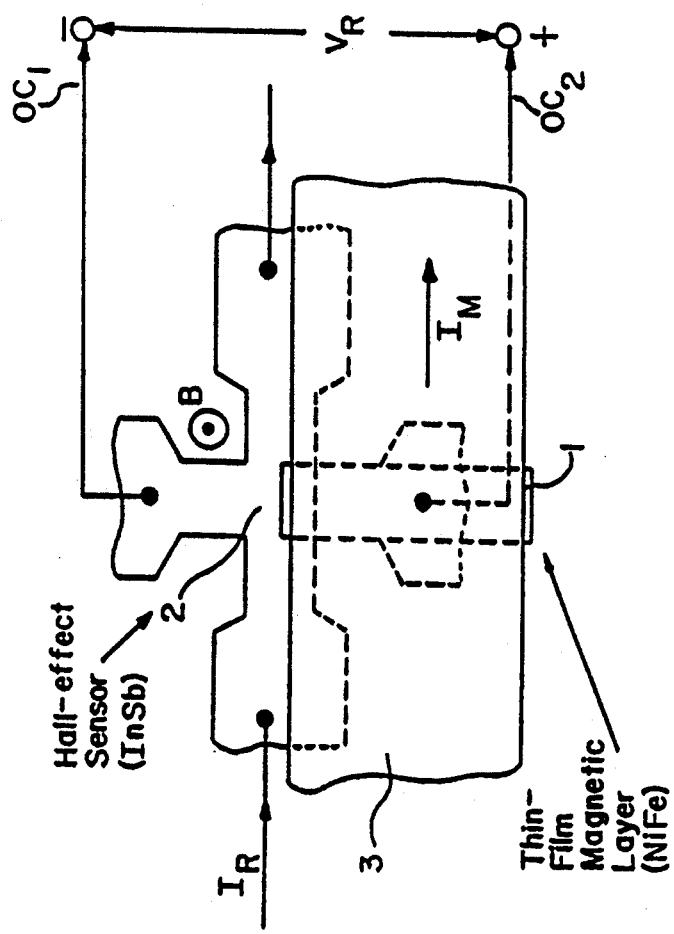
FIG. 1a illustrates the structure of a magnet-Hall (M-H) element employed in a unit memory cell of a 2×2 MHRAM memory shown in FIG. 2.

The structure of a magnet-Hall (M-H) element shown in FIG. 1a for a unit memory cell uses an in-plane, thin-film magnetic element 1 and a Hall-effect sensor 2. Since the Hall-effect sensor only detects the vertical component of the magnetic field B, the center of the sensor is positioned at the edge of one narrow end of the magnetic element 1, as shown in FIGS. 1b and 1c where the fringing field through the sensor is a maximum. Increasing the in-plane aspect ratio of the thin film magnetic element of each unit cell with a narrow end near the center of the Hall-effect sensor increases the squareness of the hysteresis loop, which in turn increases the fringing field of magnetic flux passing through the Hall-effect sensor from the proximal narrow end of the thin-film magnetic element. Because the sensor is not located on the same plane as the magnetic layer as shown in FIG. 1b, the fringing field from the magnetic element has a non-zero vertical component passing through the Hall-effect sensor. When the state of magnetization of the magnetic element is reversed by a current $I_M$ through a conductor 3 in an opposite direction, the sense of the magnetic field B also reverses, as shown in FIG. 1c. Thus, data ("0" or "1") are stored in the magnetic element permanently using the sense of the magnetization state. Data are written into the magnetic element by sending a current $I_M$ through conductor 3 in an appropriate direction. Data are read by sending a current $I_S$ through the Hall sensor. The polarity of the Hall voltage $V_R$ indicates whether the stored datum is a "1" or a "0". For an n-type material in the Hall effect sensor, a Hall voltage $V_R$ is developed across conductors OC1 and OC2 with conductor OC1 being negative with respect to terminal OC2 when the sensing current $I_M$ is flowing through it to the right, and the magnetic field B is pointing out of the paper as shown in FIG. 1a. The polarity of the Hall voltage reverses when the direction of the magnetic field B is reversed, as shown in FIG. 1b.

As will be noted more fully hereinafter, one embodiment of the invention uses CMOS integrated circuit technology with all components of an M-H element deposited on a chip. Consequently, it is to be understood that a layer of electrical insulating material is provided between the magnetic element 1 and the Hall-effect sensor 2 on one side and the conductor 3 on the other side. That is accomplished by depositing an oxide layer (not shown) over the Hall-effect sensor 2 before depositing the magnetic layer 1 and again before depositing the conductor 3 of each M-H element, or preferably diffusing the conductor 3 in a substrate and then after growing an oxide layer, depositing the thin layer of magnetic material followed by another oxide layer and then the Hall-effect sensor, thus inverting the arrangement of FIG. 1a.

Figure 2:
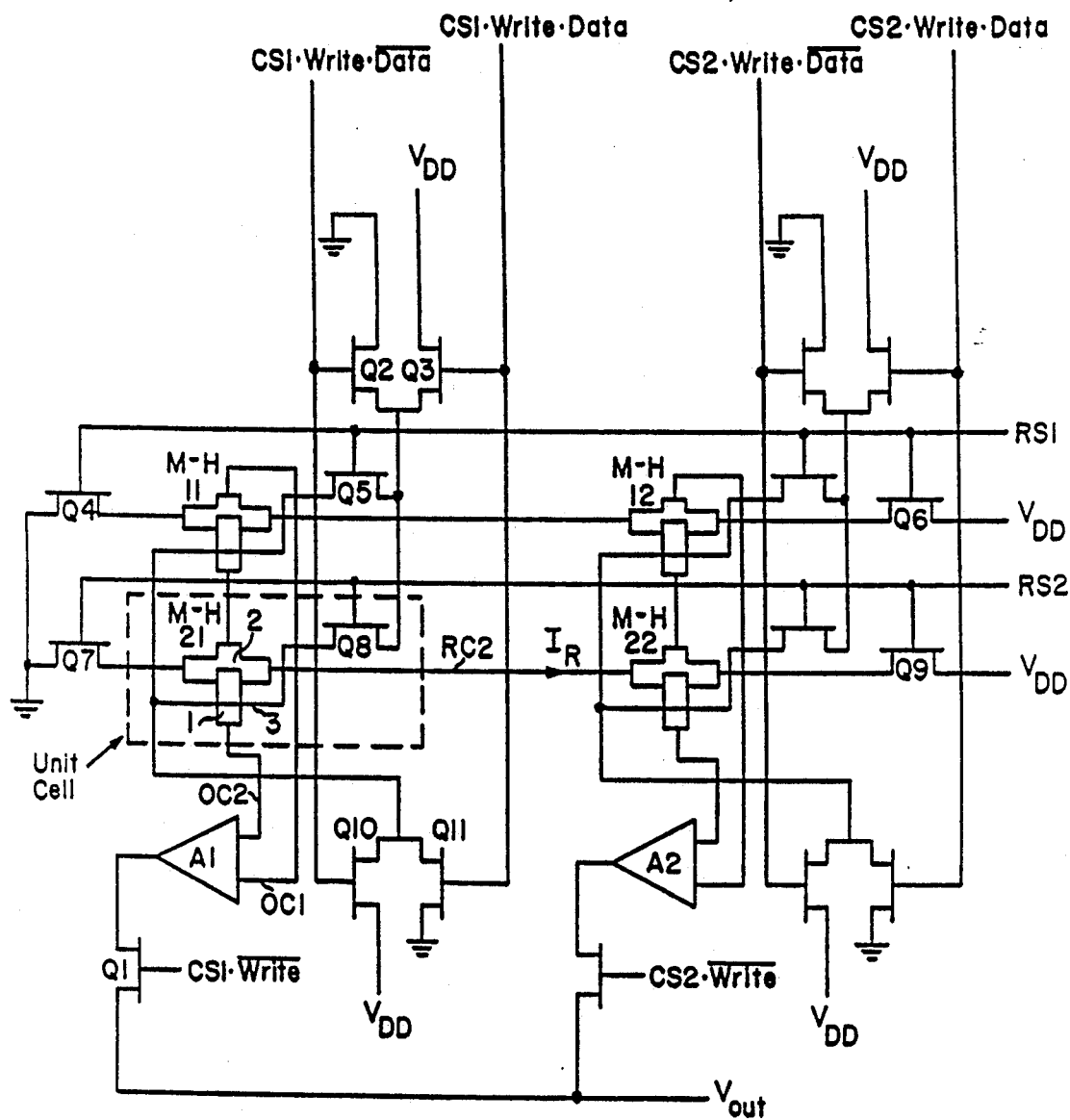
FIG. 2 is a circuit diagram of a 2×2 MHRAM memory having two rows and two columns of magnetic-Hall elements M-H 11 through M-H 22.

One organization for a 2×2 bit MHRAM is shown schematically in FIG. 2 using CMOS technology. The M-H elements are implemented with a thin-film magnetic element and a Hall sensor as shown in FIG. 1a. Consider the unit cell M-H 21 at the intersection of the second row and the first column. During reading, transistors Q7 and Q9 are turned on by an address signal RS2 which sends a sensing current through the second row conductor RC2 to produce a Hall voltage $V_R$ at every Hall-effect sensor in the second row. Each Hall voltage produced by a sensor in the first column is amplified by an amplifier A1. Note that the output voltage terminals of the Hall-effect sensors in each column are connected in series, but only one Hall-effect sensor (M-H 21) has a sensing current through it. Consequently, only that one Hall-effect sensor produces an output Hall voltage $V_R$ between output conductors OC1 and OC2 which can be calculated in volts by the equation:

$$V_R = \frac{10^{-5} R_H}{t} I_R B,$$

where
- $R_H$ = Hall coefficient, cm³/coulomb,
- $t$ = thickness of Hall sensor, cm
- $I_R$ = sense current, Amp,
- $B$ = magnetic flux density, kilogauss.

The unit cell M-H 22 in the second column also conducts the sensing current $I_R$ in the second row conductor RC2 and therefore produces a Hall voltage. However, only transistor $Q_1$ for the first column is turned on by a column select address signal CS1·$\overline{\text{Write}}$, so that only the Hall voltage output from the unit cell M-H 21 is connected to the final output, $V_{out}$.

The output sensitivity of the Hall-effect sensor using InSb semiconductor material is 0.5 mV/mA/Oe. A 10 mV output signal can be obtained at 0.4 mA and 50 Oe field. Unit cells implemented in this manner are incorporated by an integrated circuit into a matrix of read-/write cell-selecting transistors to form a non-volatile random access memory. Note that the command signal $\overline{\text{Write}}$ could be substituted by a totally separate Read command signal.

A write operation will now be described. Assume that the same unit cell M-H 21 at the intersection of the second row and the first column is selected for writing. If the bit value to be written is a "1", that is to say "data" is true, then transistors Q3, Q8 and Q11 are turned on, and if the bit value to be written is a "0", then transistors Q2, Q8 and Q10 are turned on. Which pair of transistors is turned on (Q2, Q10 or Q3, Q11) depends upon whether the data bit is 0 or 1. The bit value then determines the sense of the write current $I_M$ through the conductor 3 over the thin-film magnetic element and therefore the sense of the in-plane magnetization. Transistor Q8 is thus turned on in either case by the row select signal RS2. Transistors Q7 and Q9 are also turned on by the row select signal RS2 in the same way as for a Read operation, but there is no $V_{out}$ signal because the transistor Q1 is not turned on because although the column select signal CS1 is true, the $\overline{\text{Write}}$ command signal is not true during a Write operation.

A magnet-Hall effect random access memory (MHRAM) thus stores information magnetically in small thin-film elements of magnetic material allowing unlimited data retention time, unlimited number of rewrite cycles, and inherent radiation hardness, i.e., immunity to single-event upset (SEU) due to impact by ionized particles, making the MHRAM suitable for ground based as well as space flight applications. It is highly immune to the areal property fluctuation in the thin-film magnetic element, so that high yield can be achieved in large scale IC fabrication.

High storage density is achieved since the unit cell size is less than $100\lambda^2$, where $\lambda$ is the minimum lithographic feature size, so that a density greater than $10^6$ bit/cm² is achieved using 1 μm lithography. A unit cell consists only of one transistor and one magnet-Hall effect element, such as transistor Q8 and M-H 21 for the first column, second row of the 2×2 array of unit cells in FIG. 2. By comparison, a DRAM unit cell has one transistor and one capacitor, and an SRAM unit cell has six transistors.

Figure 3A:
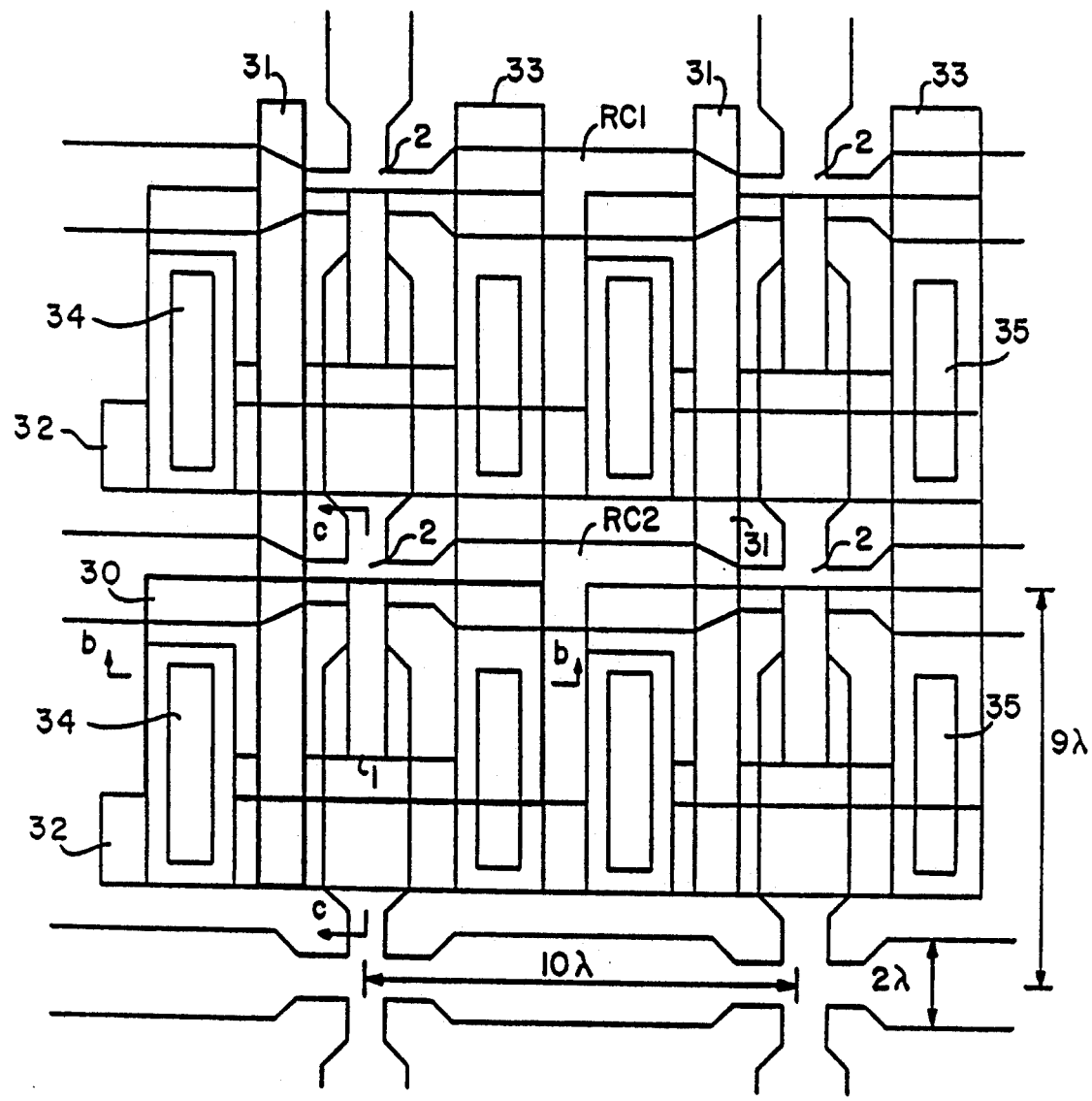
FIG. 3a illustrates an integrated circuit layout of the M-H elements for the 2×2 MHRAM memory shown in FIG. 2.

An example of the layout of a 2×2 bit MHRAM memory array of unit cells is shown in FIG. 3a without the addressing transistors and conductors, i.e., with only one transistor per unit cell used for selecting the polarity of the current $I_M$ shown in FIG. 1a to store a bit "0" or "1". That one transistor of a unit cell is formed at the intersection of a rectangular diffusion region 30 outlined by a heavy line for one unit cell, and a polysilicon region 31 similarly outlined by a heavy line. The diffusion region 30 fulfills the function of the conductor 3 in the M-H element of FIGS. 1a, 1b and 1c for one unit cell and is therefore preferably made as wide as the thin-film magnetic element 1 is long so that the current flowing through the transistor (with a polarity selected by transistors not shown in this array of unit cells) provides a uniform current across the length of the magnetic element 1, and therefore a uniform magnetic field that sets the magnetic element in the desired state. The magnetic element is shaded for that one M-H element of a single unit cell. In this layout, the size of the unit memory cell is $9 \times 10\lambda$, or $90\lambda^2$, where $\lambda$ is the minimum line width.

It should be noted that to make the MHRAM memory, only two more masking steps are required besides the standard IC processing steps for the CMOS circuitry (assuming a single-poly double-metal CMOS process of fabrication), one for deposition of the semiconductor material in the desired pattern of Hall-effect sensors and conductors and one for deposition of the desired pattern of in-plane magnetic elements. It is therefore possible to fabricate an array of unit cells in an IC chip together with the necessary addressing circuitry.

Figure 3B:
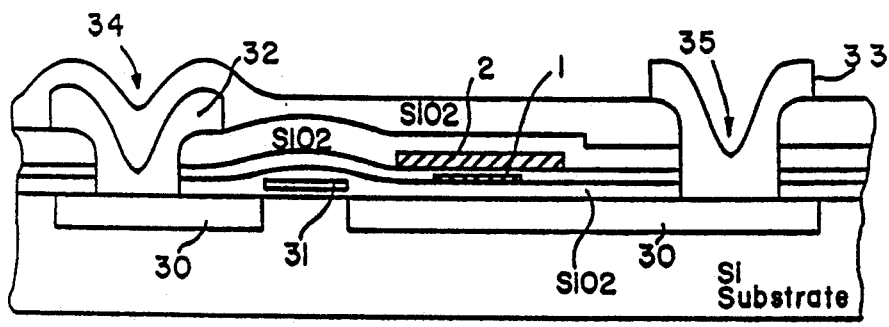
Figure 3C:
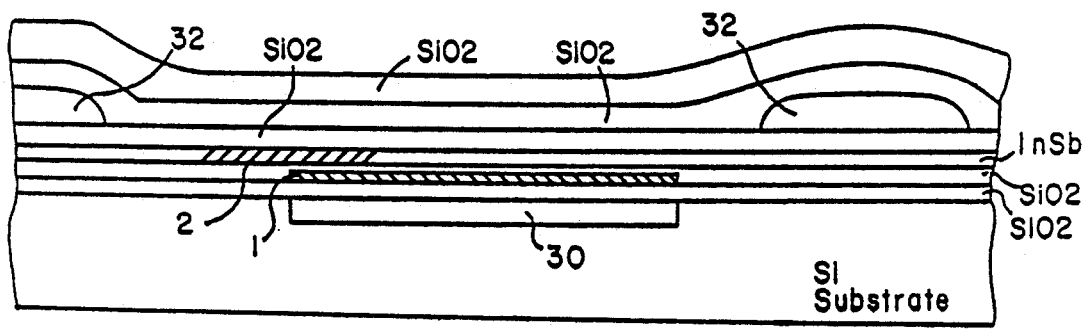

FIGS. 3b and 3c show cross-sections taken along lines b—b and c—c, respectively, for the M-H element of a single unit cell. Starting with a silicon substrate, the region 30 is created by diffusion and then a layer of $SiO_2$ is grown. Next a polysilicon strip 31 is grown (FIGS. 3a and 3c) followed by another $SiO_2$ layer. Then the layer of magnetic material is deposited. After growing another $SiO_2$ layer, the pattern of semiconductor material for the sensor is deposited. Note that the sensor pattern includes horizontal and vertical interconnecting conductors, and that only the square portion where the conductors intersect will function as the Hall sensor. That portion is shaded in FIGS. 3b and 3c. After growing another layer of $SiO_2$ a horizontal metal conductor 32 is deposited, and after growing yet another layer of $SiO_2$ a vertical metal conductor 33 is deposited. A final layer of $SiO_2$ is then grown over the entire IC chip. But first the SiO layers are opened in a rectangular region 34 to connect to one end of the diffusion region 30. Thus, rectangular region 35 is opened to connect the vertical conductor 33 to the other end of the diffusion regions 30. As noted hereinbefore, this integrated circuit layout has not been optimized, and the sequence of steps to be employed have not been finalized. The layout of FIG. 3a is presented as a suggested approach to an optimized and finalized layout with emphasis given to consideration of how to fabricate the M-H elements of the unit cells rather than the CMOS circuit shown in the schematic diagram of FIG. 2.

The MHRAM implemented with CMOS integrated circuit technology is expected to have short access times (<100 nsec). Write access time is expected to be short because on-chip transistors are used to gate current quickly, and magnetization reversal can occur in a few nanoseconds. The switching field for the magnetic storage elements using Permalloy NiFe (78.5% nickel, 21.5% iron) is about 50 Oe, so that sufficient stability is obtained while minimizing switching currents to reduce the power dissipation. Read access time is expected to be short because the Hall-effect sensor (InSb) produces a large signal voltage in response to the fringing magnetic field from the thin-film magnetic element.

Although the Permalloy NiFe is preferred, other magnetic materials may be employed, such as $\gamma$-$Fe_2O_3$ or $Fe_3O_4$, CoPt and CoPt0 or other cobalt alloys each of which may be deposited like Permalloy, e.g., by sputtering. Another possibility is cobalt polycrystal which may be vapor deposited. And although silicon is used as the substrate in order to more economically produce the CMOS integrated circuit, a GaAs substrate may be used, in which case the Hall-effect sensors and interconnecting conductors may be formed in the substrate by starting with a p-type substrate and diffusing an N-type pattern for the sensors and interconnecting conductors as suggested hereinbefore. Other substrate materials include InSb and InAs which may be preferable to GaAs. In all of these compound substrate materials, where the Hall-effect sensors and interconnecting conductors are formed by diffusion of impurities, the p-n junction needs to be reverse biased in order to isolate the sensors and interconnecting conductors. Still other variations may occur to those skilled in the art with attention to the electron mobility and Hall coefficient in order to achieve acceptable read access times for the particular application of the MHRAM fabricated.

Figure 16:
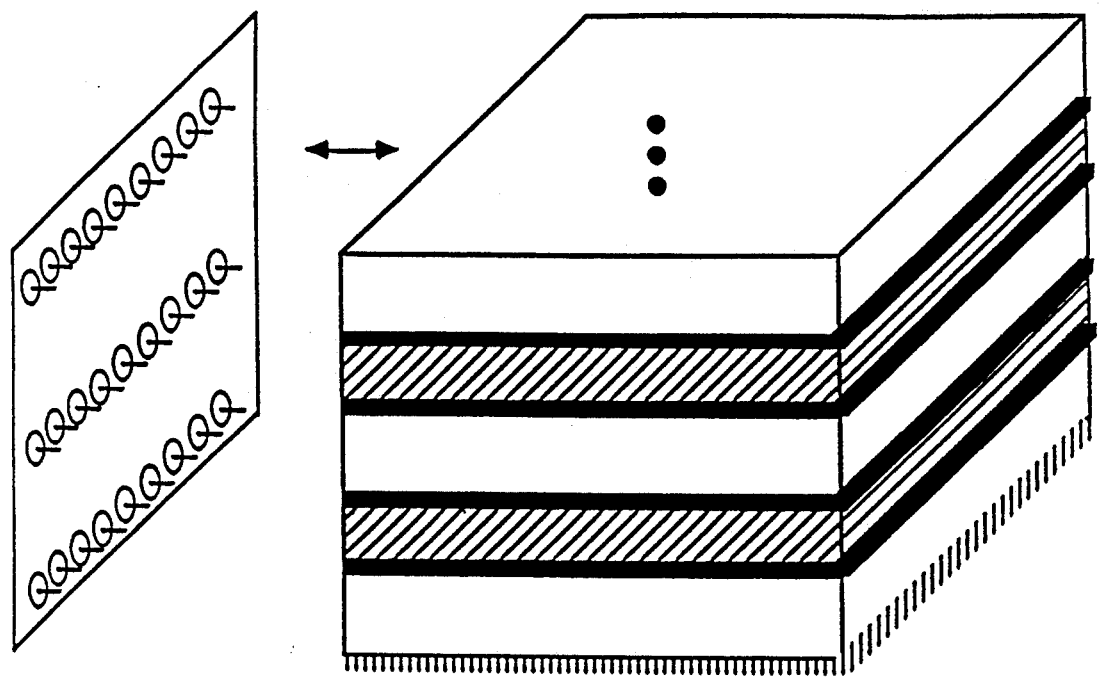
FIG. 16 is a schematic representation of a three-dimensional non-volatile RAM in accordance with the present invention.

The organization of a memory plane using in-plane M-H elements has been shown in FIG. 3a for illustrative purposes; it has not been optimized for density, power or speed considerations. In implementing a full memory having N-bits per word, N memory planes would be stacked and driven together for row and column select (i.e., for selection of an N-bit memory location) while each plane is controlled individually for storing individual bits in the separate memories just as in a conventional RAM scheme. Each M-H element in every plane is implemented as shown in FIGS. 1a, 1b and 1c, and every plane is organized as shown in FIG. 2. The same cell is selected in the same way for every plane, only the data bit stored in the selected unit cell of each plane may differ from the other planes. FIG. 16 is a schematic drawing of such a three-dimensional package. A plurality of memory chips are bound together using a packaging adhesive such as an epoxy. Heat sinking material, such as aluminum or copper can be added if needed. Contacts can be provided from the chip edges to the exterior of the package.

The number of sense amplifiers in each plane can be reduced from one for each column to just one for the entire plane if each selection transistor corresponding to the transistor Q1 in FIG. 2 is placed at an input terminal of the one sense amplifier, thus time-sharing with each column the single sense amplifier for the plane. This is possible because only one column may be selected to read out at any one time from each memory plane.

The write operation for a full memory is straightforward. The value of the datum determines the sense of the current $I_M$ through the conductor 3 over the magnetic element 1 as shown in FIG. 1a and therefore the sense of the in-plane magnetization. Note that there is no half-select problem which exists in core memory, i.e., the switching current $I_M$ is applied only to the magnetic element of the selected unit cell of each plane, the rest of the magnetic elements in the entire memory are not subjected to any switching current. Consequently, the switching current can be set higher than the maximum required switching threshold of the magnetic element and the writing process is immune to fluctuations in the threshold value. With this memory organization, large operating margins and hence high chip yields can be achieved.

A full memory organized in accordance with this invention can replace ROMs, EPROMs, and SRAMs because it offers better performance in every aspect with higher density, higher speed, lower cost, lower power dissipation and true non-volatility.

Reference will now be made to FIGS. 4a, 4b and 4c. A new Hall effect sensor, having high sensitivity, for the micromagnet Hall effect random access memory (MHRAM) will be described. The new Hall sensor utilizes a molecular beam epitaxy (MBE) grown InAs thin film on the silicon substrate. To achieve high electron mobility and thus high Hall effect sensitivity, a gallium arsenide/aluminum gallium arsenide/indium aluminum arsenide (GaAs/AlGaAs/InAlAs) superlattice layer is used as the buffer layer between the silicon substrate and the InAs layer to reduce the crystalline imperfections caused by the 12% lattice mismatch between silicon and InAs single crystals. A room temperature electron mobility of more than 10,000 $cm^2$/sec-V can be obtained in the InAs film prepared by this method.

In the MHRAM of the present invention, a high sensitivity Hall effect sensor is very crucial to the practical operation of the MHRAM. In order to achieve a reliable and fast read out signal of $\pm 10$ mV, the Hall sensor material must have an electron mobility larger than 10,000 $cm^2$/sec-V, and a film thickness less than 1 $\mu$m. The reasons for the less than 1 $\mu$m thickness requirement are (1) to reduce the step coverage problem in the device fabrication; and (2) to limit the current so that a smaller transistor can be used to gate it. In the description above, indium antimonide (InSb) was proposed as the Hall sensor material. The room temperature electron mobility of a single crystal InSb is 78,000 $cm^2$/sec-V. However, for the thermally evaporated or sputtered InSb thin films, the deposited film is a polycrystalline film. The large number of crystalline imperfections causes the electron mobility to degrade to about 300 $cm^2$/sec-V. Various thermal annealing techniques can be used to increase the grain size of the polycrystalline film and increase the mobility. However, such high mobilities are only obtained in films thicker than 2 $\mu$m.

Another approach is to use MBE to grow InSb on the silicon. However, the lattice constant of the silicon crystal is 5.4308 Å, and that of the InSb is 6.4788 Å. There is a 19% lattice mismatch between the two materials so that a good quality InSb layer is difficult to fabricate.

In order to overcome this drawback of InSb, indium arsenide (InAs) thin film grown by MBE is proposed as the Hall sensor material. The room temperature electron mobility of single crystal InAs is 33,000 cm$^2$/sec-V. The lattice constant of InAs is 6.0585 Å, which represents a 11.6% lattice mismatch to the silicon. Although this mismatch is considerably smaller than that of the InSb, a high quality single crystal InAs film still can not be fabricated directly on the silicon substrate. To achieve a high quality film, electrically insulating materials with intermediate lattice constants must be used as buffer layers. The insulating property of the buffer layer is important to avoid shorting out the Hall voltage.

Three structures are shown in FIG. 4. In the structure shown in FIG. 4a, a 2000 Å thick aluminum arsenide/gallium arsenide (AlAs/GaAs) superlattice is used as a buffer layer between the 1 μm thick InAs film and the silicon substrate. In FIG. 4b, the buffer layer is still the same AlAs/GaAs, but the InAs film thickness is increased to 2 μm. The GaAs has a lattice constant of 5.6534 Å, which is a 4.1% mismatch to the silicon, and the lattice constant of the AlAs is between that of the GaAs and InAs. The more gradual change of lattice constant introduced by the buffer layers increases the quality of the InAs film. The mobilities of the InAs films in FIGS. 4a and 4b are 5,400 and 9,000 cm$^2$/sec-V, respectively.

In FIG. 4c a GaAs/AlGaAs superlattice layer and an InAlAs layer are used as buffer layers to the 1 μm thick InAs. The total thickness of the buffer layers is 0.5 μm. Using AlGaAs and InAlAs, and increasing the buffer layer thickness from 0.2 μm to 0.5 μm makes the transition of the lattice mismatch smoother. Thus, an even higher quality InAs single crystal film can be obtained.

Figure 5:
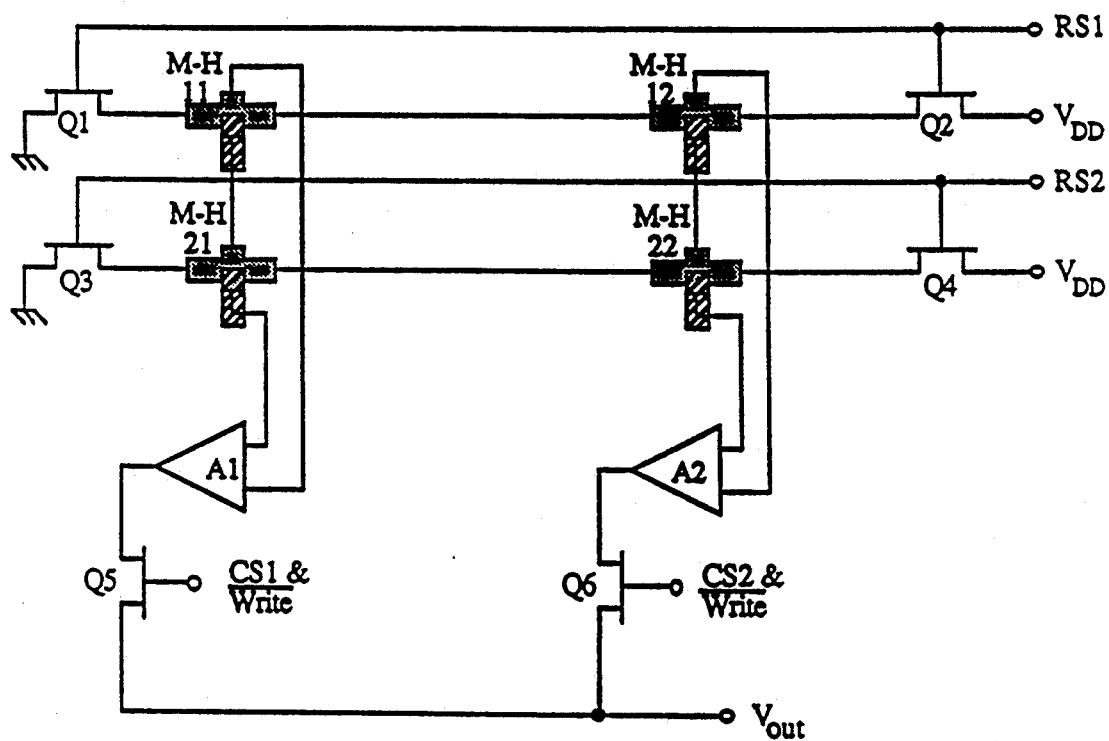
FIG. 5 is a circuit diagram similar to that of FIG. 2, but used to explain a potential problem with read-out voltage.
Figure 6:
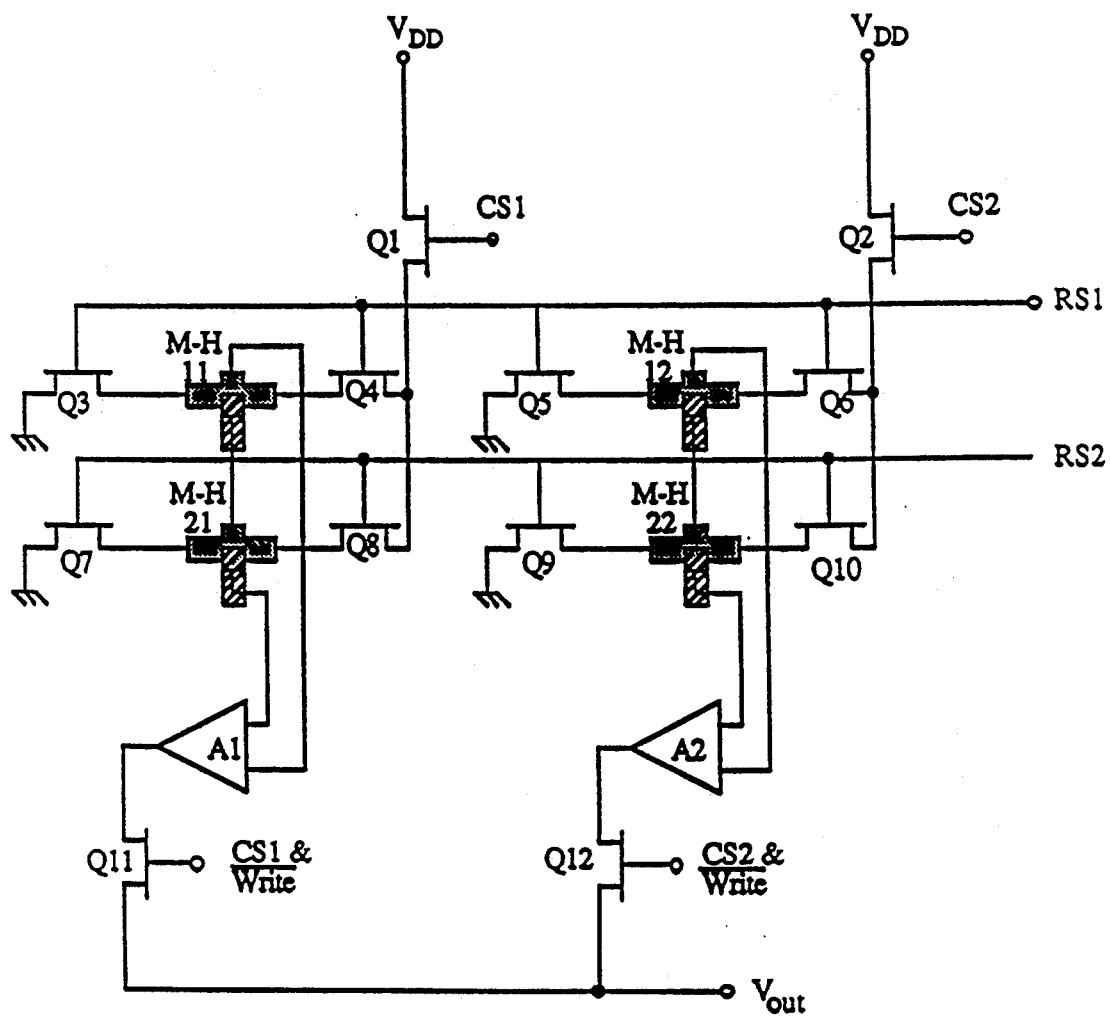
FIG. 6 is a circuit design illustrating one alternative remedy for the problem described in conjunction with FIG. 5.
Figure 7:
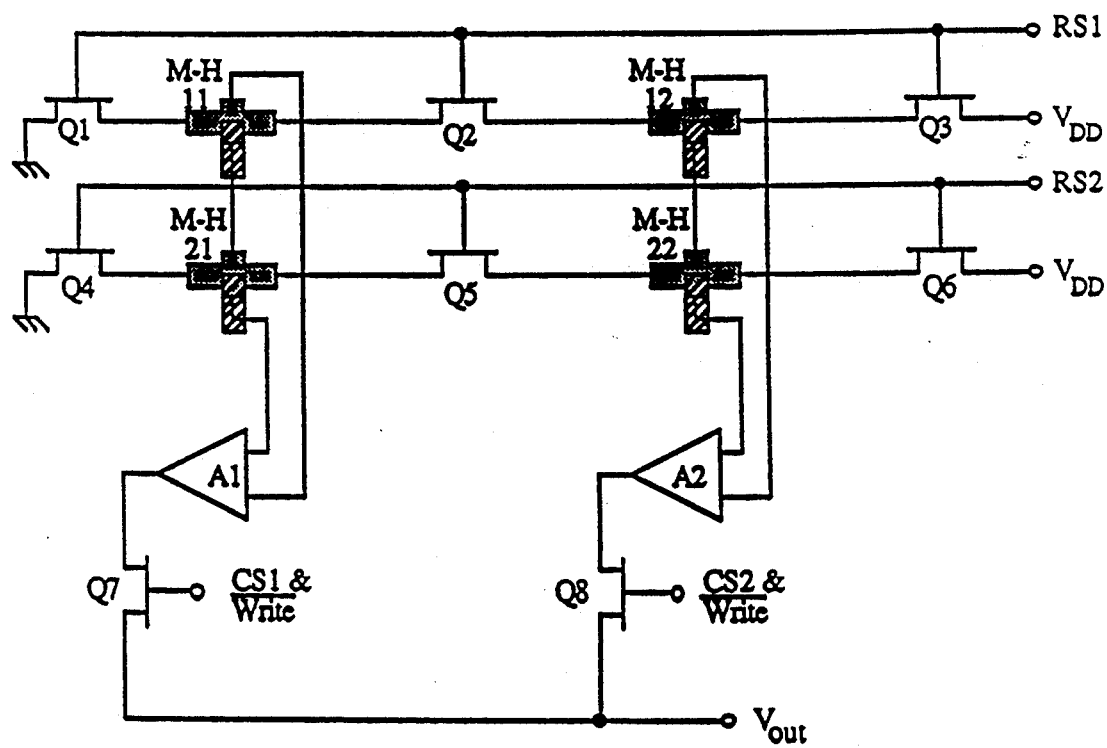
FIG. 7 is a circuit design illustrating another alternative remedy for the problem described in conjunction with FIG. 5.

Reference will now be made to FIGS. 5 through 7. Two micromagnet Hall effect random access memory (MHRAM) cell designs are disclosed to avoid a current shunting problem when these memory cells are organized into a matrix to form a large memory. The first design uses two transistors in each memory cell to isolate the current leads of the Hall sensor from that of the rest of Hall sensors in the memory matrix. Therefore, the current in the selected Hall sensor will not be shunted by the Hall sensors in the other memory cell. The second design uses at most 1.5 transistors per cell to achieve the isolation.

The memory organization for the read-out in the proposed MHRAM is reproduced in FIG. 5 in which the memory cells are organized as a matrix with two rows and two columns. In order to share the sense amplifier, all the voltage leads of the Hall sensors in the same column are connected in series, e.g., the voltage leads of the Hall sensors in the first column M-H11 and M-H21 are connected in series, and are fed into the sense amplifier A1, so that only one sense amplifier is needed for each column. The current leads of the Hall sensors on the same row are also connected in series. Each row is controlled by two transistors, one on each end of the row. To read the cell M-H21, the signals RS2 (row select 2) and CS1 (column select 1) become high, and the Write becomes low, so that transistors Q3, Q4 and Q5 are turned on. With Q3 and Q4 turned on, a current flows through the Hall sensor in M-H22 and M-H21, so that both sense amplifiers A1 and A2 produce a signal. However, since Q6 is not turned on, only the signal from A1 is passed by Q5 to the output, V$_{out}$. The problem with this design is that the Hall sensors are resistive loads. When Q3 and Q4 are turned on to let the current flow through M-H22 and M-H21, the current can also flow from the upper voltage lead of the M-H22 to M-H12 and M-H11, and back to M-H21. This current shunting will introduce a voltage drop across the voltage leads of the cell M-H11 and M-H12. This voltage will be added to the Hall voltage developed across cell M-H21 and M-H22 and be presented to the inputs of the sense amplifiers A1 and A2, resulting in an error in read-out voltage.

A circuit design with two transistors in each cell to prevent the current shunting is shown in FIG. 6. Another circuit design with at most 1.5 transistors in each cell to prevent the current shunting is shown in FIG. 7.

In FIG. 6 each Hall sensor is isolated by two transistors, one on each side of the current leads, e.g., M-H21 is isolated by transistors Q7 and Q8. To read the information from the cell M-H21, CS1 and RS2 become high, and Write becomes low. Current flows from V$_{DD}$ through Q1, Q8, M-H21, and Q7 to ground. Transistor Q4 prevents the current from flowing through M-H11 to M-H21. Transistor Q3 prevents the current from flowing through M-H11 to ground. Thus, there is no current shunting problem. When RS2 becomes high, transistors Q9 and Q10 are also turned on. Since Q2 is turned off, there is no current flowing through M-H22.

In FIG. 7 the current leads of the Hall sensors in the same row are connected in series. When RS2 becomes high, transistors Q4, Q5 and Q6 are turned on, sending current through M-H21 and M-H22. Transistors Q1 and Q2 prevent the cell M-H11 from shunting the cell M-H21, and transistors Q2 and Q3 prevent the cell M-H12 from shunting the cell M-H22. With CS1 being high and Write being low, the output from the sense amplifier A1 is passed to the output V$_{out}$. The advantage of this design is that on average each cell only requires 1.5 transistors. The disadvantage is that only half of the supply voltage is used to generate the Hall voltage. The adaptation of this design to a larger memory array is straightforward. In general, the number of transistors needed per cell is (N+1)/N, where N is the number of cells in a row. In fact, the design shown in FIG. 6 is a special case of this design with N=1.

Figure 8:
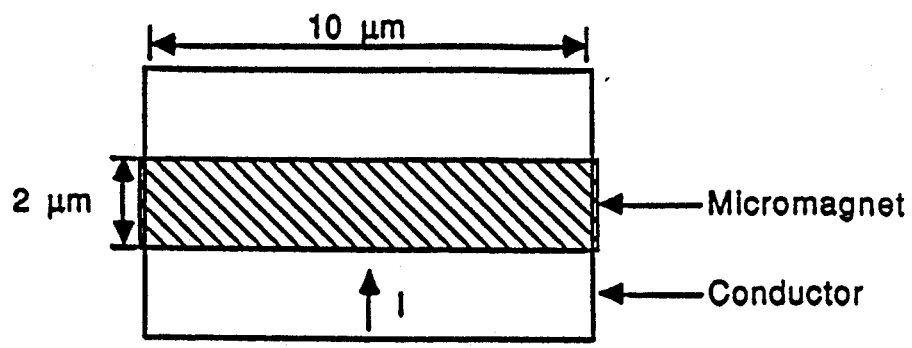
FIG. 8 is a simplified illustration of a micromagnet used in the invention and including a wide conventional conductor for magnetizing the micromagnet.
Figure 9:
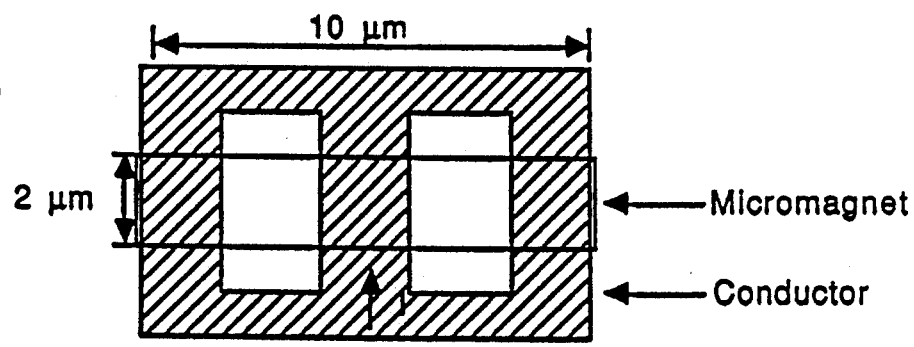
FIG. 9 is a simplified illustration of the micromagnet of FIG. 8, but shown with a "picture frame" conductor for reducing the magnetizing current.
Figure 10:
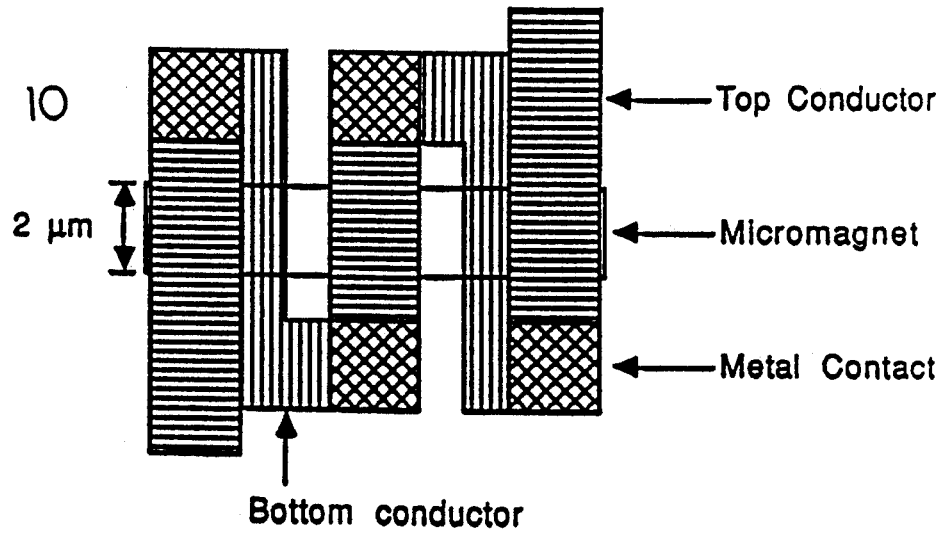
FIG. 10 is a simplified illustration of the micromagnet of FIG. 8, but shown with two metalization layers for further reducing the magnetizing current.

Reference will now be made to FIGS. 8 through 10. Two new magnetizing conductor designs for the micromagnet Hall effect random access memory (MHRAM) are described. By using a picture-frame-like conductor, the first design can reduce the required magnetizing current by a factor of 2, thus reducing the size of the switching transistor and power dissipation by a factor of 2. By using two metalization layers to make up the magnetizing conductor, the second design can reduce the required current by a factor of 25.

In the MHRAM, the information is stored in a piece of micromagnet with an in-plane aspect ratio of greater than 4 to 1. In this discussion, a 2 μm by 10 μm piece of micromagnet is used as an example. In order to magnetize the micromagnet into the desired magnetization state, a 10 μm wide conductor deposited on top of the micromagnet is proposed, as shown in FIG. 8. If the current is flowing upward, it creates an in-plane field pointing to the left in the micromagnet, and vice versa. The magnitude of the in-plane field at the micromagnet is proportional to the linear current density in the conductor. Because the spacing between the conductor and the micromagnet is typically much smaller than the conductor width, it can be assumed that a 1 mA/μm linear current density will generate a 6 Oe in-plane field in the micromagnet. Assuming a 60 Oe field is required to magnetize the micromagnet, then the total current required is 100 mA. If a 1 μm by 5 μm micromagnet is used, then the required current is 50 mA. Currents of this amplitude are very difficult to handle by a modest size transistor.

By taking advantage of the high permeability of the micromagnet, a picture frame-like conductor can be used to reduce the required current. An even bigger reduction in current can be obtained if two metalization layers are available to make an integrated coil wrapping around the micromagnet.

A picture frame-like conductor is shown in FIG. 9. Because of the high permeability of the micromagnet, the magnetic field in the gap of the picture frame is almost the same as the field underneath the conductor. Therefore, a 1 mA/μm current still produce about 6 Oe in-plane field in the micromagnet. Since the total conductor width is reduced by half, the current required is reduced to 50 mA and 25 mA, respectively for the 10 μm and 5 μm wide micromagnet.

If two metalization layers are available, a 2.5 turn coil can be fabricated around the micromagnet, as shown in FIG. 10 where the top and bottom conductors are shown as the horizontally and vertically shaded regions, respectively. The cross-hatched regions are the vias for the metal contacts. Because the effective turn number increases from 0.5 to 2.5, the linear current density needed to generate a 60 Oe field decreases from 10 mA/μm to 2 mA/μm. Since the conductor width is 2 μm, the total current required is 4 mA. Thus, ideally, a factor of 25 reduction in current can be achieved.

Reference will now be made to FIGS. 11 through 15. A random access memory is described which offers non-volatile storage, fast read and write times, and radiation and SEU hardness. A switchable, magnetic material is used to provide non-volatile information storage. A semiconducting material with high mobility is used to provide magnetic field sensing for readback, and also for providing active circuitry that controls writing and readback at each selected memory cell.

This memory cell potentially offers performance advantages over conventional semiconductor static and dynamic random access memories. By using high-mobility and radiation-tolerant gallium arsenide for both the magnetic field sensor and transistor material, read and write times may approach and become smaller than the 0.1 nanosecond (100 picosecond) barrier without sacrificing radiation hardness. The resulting memory cell is relatively simple because the sensor and memory transistors are patterned from the same material. This simplicity is expected to produce a simple device fabrication process as compared to alternative memory technologies, and should achieve high yield and low cost. Such a memory could support high performance computing in commercial, industrial, and hostile environments.

Most computing applications require random access memories to support computation. Computing applications arise in which very fast read and write times are needed when memory latency becomes a critical limit to processing throughput capability.

Non-volatility is often required in addition to high capacity and rapid access. Non-volatility for example, increases fault tolerance in industrial and hostile environments. Non-volatility leads to very low power consumption in high performance computing environments, including distributed and parallel environments, in which a considerable amount of memory is kept on-line. Portable computing and environments involving transport, including spaceflight are additional applications in which power availability is a constraint.

Single-event and total dose radiation requirements also occur in harsh environments including certain industrial and extraterrestrial environments. Further, the construction of a simple device is desired to maximize yield during fabrication, in order to maximize performance margins during operation and to minimize cost.

The RAM memory cells discussed above are designed to be compatible with common and established Complementary Metal Oxide Semiconductor (CMOS) technologies and constitute improvements with respect to their prior art. In this proposed device, three advantages are reported, as discussed below, that are in part a consequence of replacing CMOS technology with GaAs technology.

First, the read and write access times of the CMOS embodiment is limited in part by the switching times of the silicon transistors that are used in those devices. The device proposed here uses high electron-mobility gallium arsenide MESFETs (MEtal-Semiconductor Field-Effect Transistors). MESFETs have electron mobilities that are seven times greater than silicon transistors. This higher mobility allows MESFETs to switch faster than silicon transistors. MESFETs have been reported that switch as quickly as 60 picoseconds. Therefore, carefully designed and fabricated integrated chips using MESFETs are expected to yield very fast devices that operate in times less than 1 nanosecond.

Second, although the storage material described above is radiation hard, the radiation hardness is limited by the susceptibility of the silicon devices to total dose and single-event ionizing radiation. Thus, the potential exists for undesired bit flips to occur during reading and writing and when transistors are transiently energized or are induced to latch-up semipermanently. The proposed device uses similar magnetic material for realizing the storage function with its inherent radiation hardness, but uses gallium arsenide transistors that are more radiation hard and can have total does radiation hardness levels in excess of 10 Mrad.

Third, in the CMOS embodiment, separate materials are used respectively for the switching transistors, the magnetic field sensor, and the magnetic storage element. This increases the demands on materials and processing and potentially limits yield and increases cost. The device proposed here uses only two materials which significantly reduces the potential processing complexity and should lead to high process yields.

Figure 11:
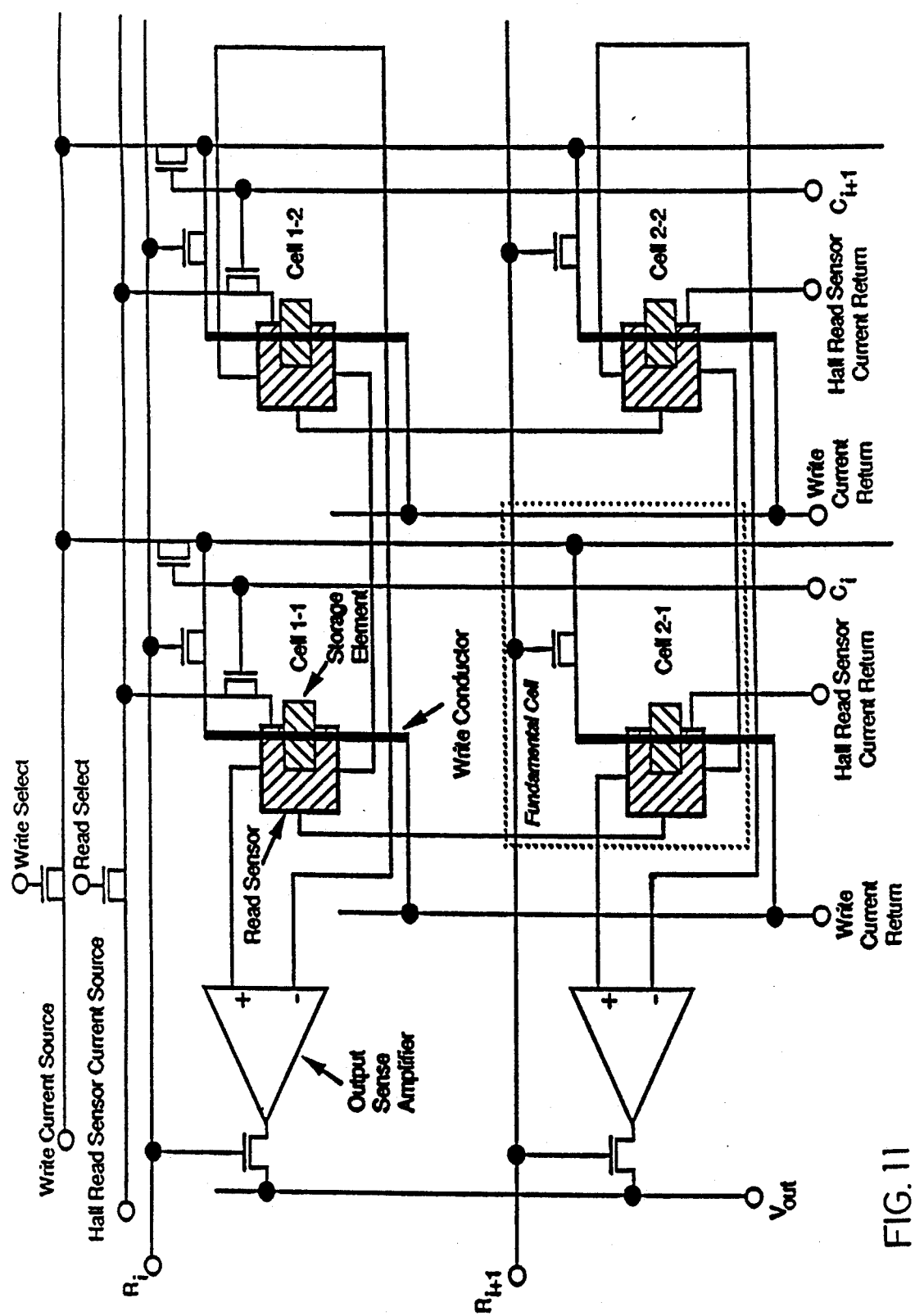
FIG. 11 is a schematic areal layout of a 2 bit×2 bit MHRAM example of the invention using GaAs technology.
Figure 12:
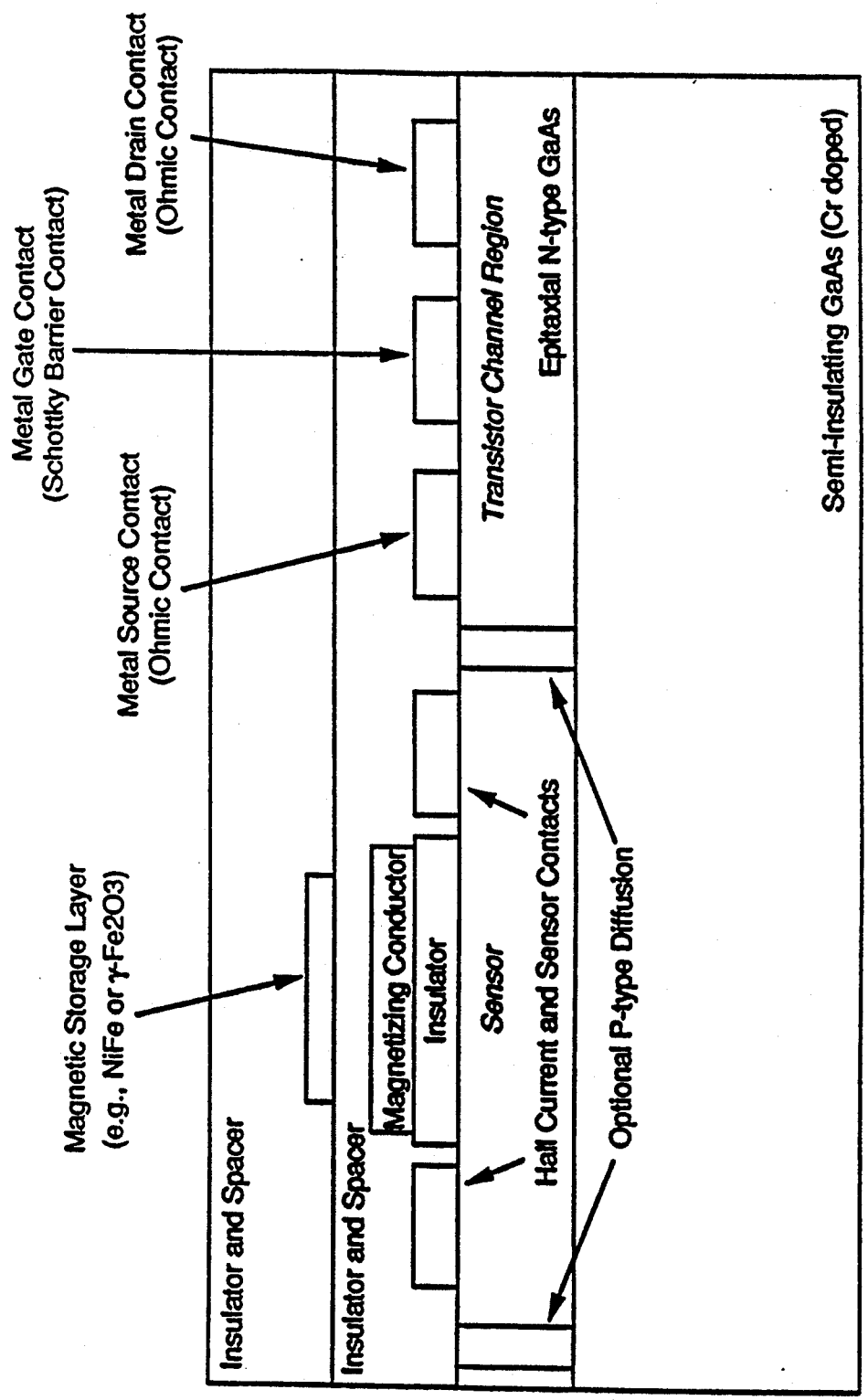
FIG. 12 is a schematic cross-sectional layout of a GaAs MHRAM cell that uses GaAs MESFET transistors.
Figure 13:
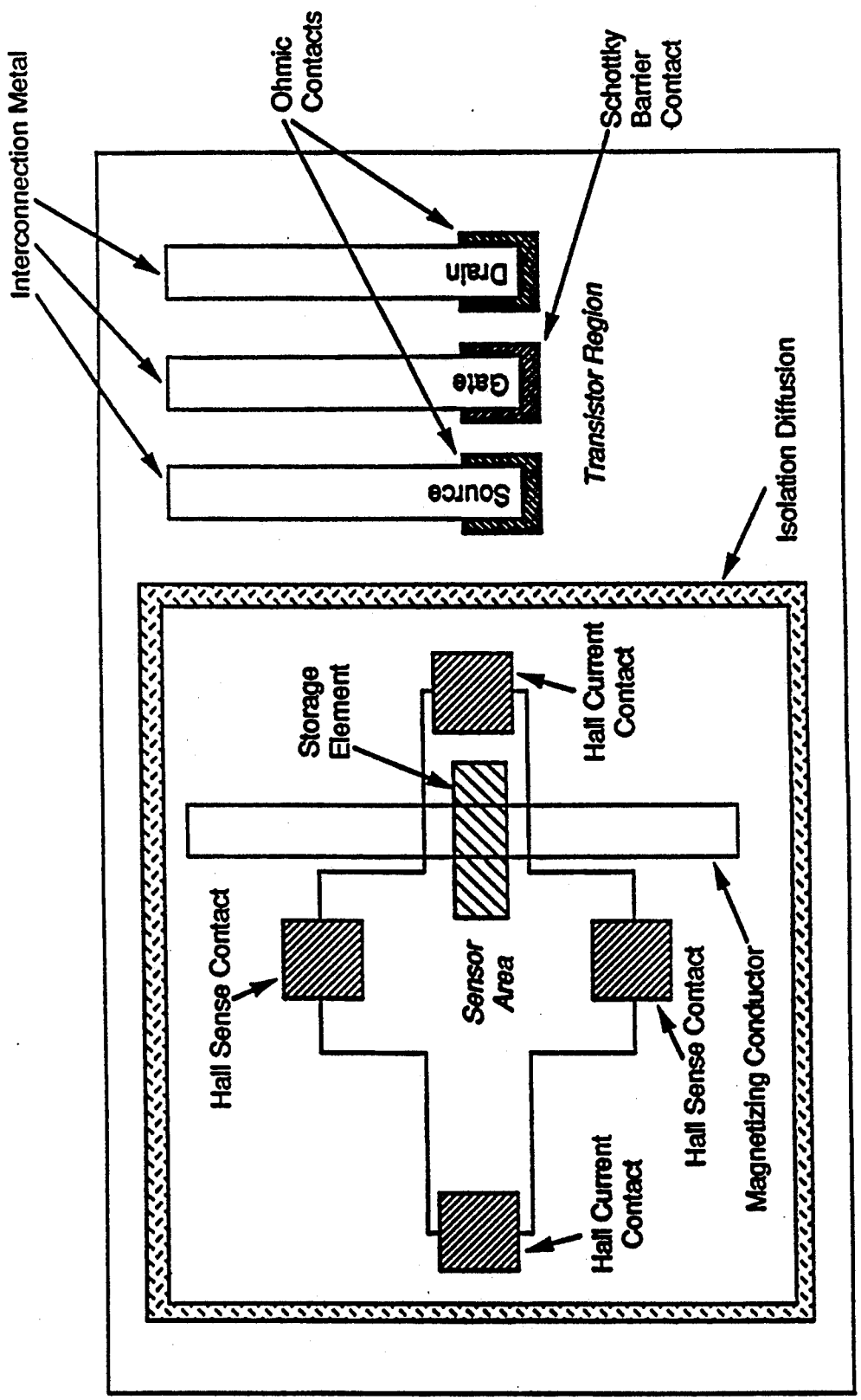
FIG. 13 is a top view of the GaAs MHRAM cell of FIG. 12.
Figure 14:
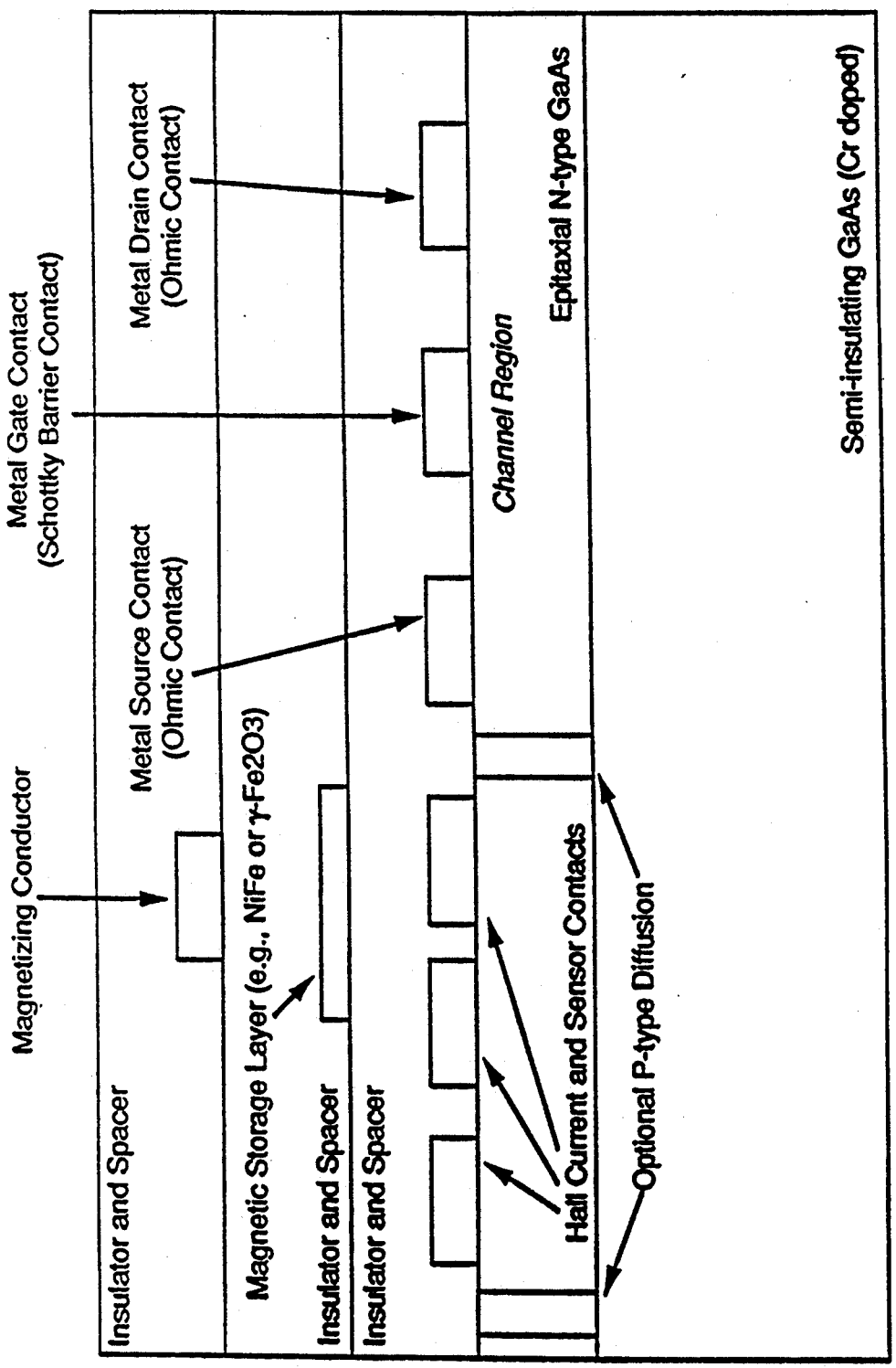
FIG. 14 is a schematic cross-sectional layout of a GaAs MHRAM cell similar to that of FIG. 12, but wherein the magnetizing conductor is placed in a layer separate from the Hall conductors.
Figure 15:
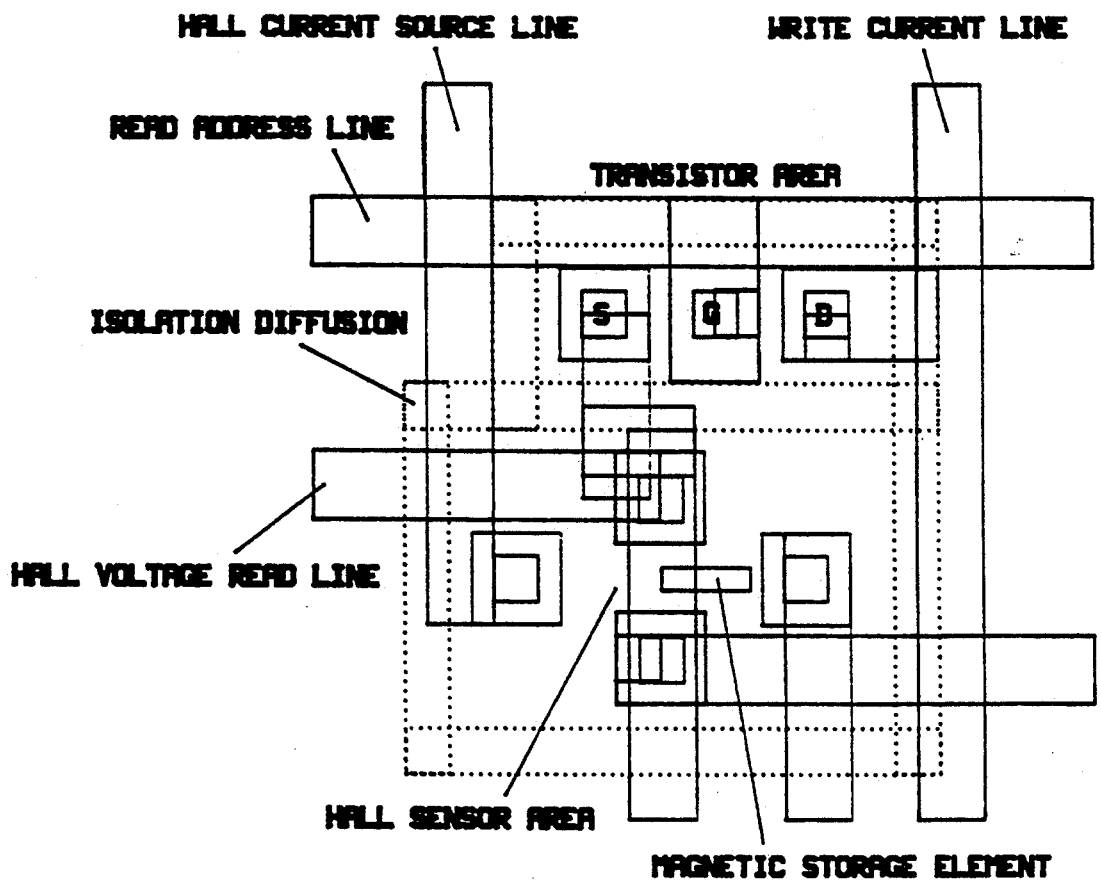
FIG. 15 is a sample VLSI layout of a GaAs MHRAM cell.

The solution to these problems is to construct memory cells with the desired capabilities that can be replicated into memory arrays. A sample four-bit memory array is shown in FIG. 11. Sample cross-sectional views of the proposed memory cell are shown in FIGS. 12 and 14. A sample top view of the proposed memory cell is shown in FIG. 13 and a corresponding VLSI layout is shown in FIG. 15.

The memory element to be described is shown embedded within a four-bit memory array in FIG. 11. Transistors are shown that serve to gate writing and read signals, depending on whether writing or readback modes are selected and depending on which row and column address and hence which memory cell is uniquely selected.

During the write process, current from the Write Current Source line is gated to the appropriate memory cell. This current magnetizes the storage element within the selected cell into the appropriate magnetic state.

During the read process, the Write Current Source line is deactivated. The Hall Read Sensor current source is activated to provide sense current to the appropriate column of memory cells, as shown. At the same time the Hall voltage from each row of memory cells is sensed. Note that only one element is actively sensed in each row because the Hall sense current is applied to only one column. This feature effectively selects the desired column. The read signal from the desired memory cell is then obtained by gating the read signal from the desired row onto the output voltage line.

FIG. 11 shows that the memory cell that defines the period of the memory array consists of one transistor coupled to a storage element that is placed on a Hall sensor. This memory cell can be made into a high-density standard cell with dimensions on the order of tens of $\lambda$ by tens of $\lambda$, where $\lambda$ is the minimum line width of the fabrication process. The additional signal-gating transistors, current-gating transistors, and the read sense amplifiers that are shown are needed only once along the row and column dimensions.

Shown in FIG. 12 is a cross-section of a MESFET and the non-volatile storage cell and read sensor. The transistor is formed using a thin ($\approx 0.2$ $\mu$m) epitaxial GaAs layer that is grown on a semi-insulating GaAs substrate. Source and drain contacts are formed as ohmic contacts between the GaAs and the metal leads that are used for providing interconnection wiring. The gate is formed between the metal lead and the GaAs material using a Schottky barrier contact. Such a transistor can switch at rates up to tens of gigahertz.

A cross-sectional view of the storage cell is shown in FIG. 12 next to the MESFET. The sensor uses the same GaAs layer that is used to create the transistor. The GaAs sensor can be doped if necessary, for example to be N-type and an optional p-type diffusion can be used to isolate the sensor from the transistor. An insulator is deposited where needed, and a metal, such as A1 or AlCu or Au-Ge/TiW/Av is deposited to make the Hall read current contacts, the Hall sensor contacts, and the conductors that are used to magnetize the magnetic storage elements. The magnetic storage material such as NiFe permalloy, CoPt0, CoPt, or $\gamma$-$Fe_2O_3$, is deposited after an insulating and/or planarization layer is deposited on top of the conductors. The device is complete after a passivation and/or scratch protection layer is placed on the magnetic storage layer.

Although device fabrication is simplified when the same GaAs layer is used to fabricate both the MESFETs and the Hall effect sensors, it is noted that the GaAs layer can also be used as a substrate upon which a separate Hall effect sensor layer can be grown. For example, if necessary, higher mobility Hall effect materials, such as InSb or InAs, or higher quality GaAs films can be grown epitaxially to increase the read signal.

Shown in FIG. 13 is a schematic areal (i.e., top view) layout of a MESFET with a non-volatile storage element and read sensor. The transistor region, with the source, gate and drain is shown to the right and the storage and sensor cell is shown at left within the optional isolation diffusion. It is noted that the isolation diffusion can be made to inscribe the MESFET if desired. The Hall sensor is shown with the paired Hall current contacts which provide the Hall current and with the paired Hall sense contacts that measure the Hall output voltage. The magnetic storage element is shown with its magnetizing conductor.

To optimize device performance, device operating margins, fabrication, convenience, yield and cost, permutations can be made to the order in which materials are deposited. As an example, shown in FIG. 14 is a cross-sectional view of another version of the storage device and MESFET that are shown in FIG. 12. The magnetic storage layer has been deposited before the magnetizing conductor. This change eliminates the requirement of an additional insulating layer before depositing the Hall current and sensor metals and may simplify planarization for the magnetic layer. However, two separate metal depositions are required.

Shown in FIG. 15 is a device layout of the schematic areal layout shown in FIG. 13. Extremely conservative design rules have been used and considerable optimization to educe device area is expected in practice. The cell fits within a square 30$\lambda$ by 30$\lambda$, where $\lambda$ is the minimum feature size. If $\lambda=1$ $\mu$m, then the cell consumes 900 square microns, which readily scales to a 64 kilobit chip. Reducing $\lambda$ and reducing the device size through optimization should yield 256 kilobit, 1 Megabit, and still higher capacity memory chips using conventional die sizes.

During the writing process, the speed of the device will be governed by the switching speeds of the MESFETs and the magnetic storage material and by line capacitance. During the read cycle, speed is governed by the switching speed of the MESFETs, line capacitance, and the Hall sensing time. During the writing process, since MESFETs are to be used, their switching speeds should be less than 1000 picoseconds and may approach 60 picoseconds. The switching speed of the magnetic storage element is expected to be between 500 and 5000 picoseconds. The ability to achieve subnanosecond writing times will then depend on the quality of the device layout and minimization of charging capacitance.

The rate of the read process will similarly be affected by the switching transistors, which, as mentioned above, are expected to switch in times between 60 picoseconds to 1000 picoseconds. The rate at which the Hall sensor can generate a Hall voltage should be limited by carrier transit times, so that line capacitance and amplifier propagation delays are expected to be the rate-limiting features. Depending on layout and sense amplifier design, read times are expected to be between 500 picoseconds and 5 nanoseconds. Integration of the read signal is not expected to be necessary since the Hall effect is expected to produce a substantial read signal.

The following sample analysis indicates that read signals are expected to be high. As an example, data indicate that a sample with a mobility of 10,000 $cm^2$/Volt/sec produces a read voltage of 3 mV at a current of 19 mA, corresponding to a current density of $2 \times 10^3$ $A/cm^2$, for a fringing magnetic field of 50 Oe on a large thin-flim InSb sample of length 5 mm, width 1.3 mm, and thickness 0.7 $\mu$m. Consider a GaAs Hall sensor that can be used in this device with the same thickness, but with lengths and widths each reduced by a factor of 1000, forming an element that is 5 $\mu$m long, 1.3 $\mu$m wide, and 0.7 $\mu$m thick.

More than adequate margin is projected to be available to achieve successful readback, even though the mobility is reduced by 50% from 10,000 $cm^2$/Volt/sec to 5000 $cm^2$/Volt/sec. First, in practice, a minimum read signal of only 600 $\mu$V, and not 3 mV, is what is necessary to differentiate binary data levels at an error rate better than $10^{-6}$ at conventional data storage bandwidths. However, if additional signal is required to increase margin or bandwidth, the 50% reduction in electron mobility can be readily compensated by increasing the current density and/or increasing the magnetic fringing field from the storage element. The read signal can be increased in proportion to the current density, which can be increased from $2 \times 10^6$ A/cm$^2$ by at least another factor of 10 before approaching the electromigration limit. Additionally, the read signal can be increased in proportion to the fringing magnetic field from the storage element. The read signal can be increased by increasing the magnetic storage element's magnetization and adjusting its coercivity. The option also exists, as described above, to maintain or increase by the electron mobility of the Hall sensor layer by growing a separate high-mobility layer using the existing GaAs layer as a substrate.

Power consumption in the device is expected to be low. During readback, (the worst case), continuously-driven, upper-bound power consumption is given approximately by the Hall current power, which is estimated as 5 V × 19 mA = 95 mW. During writing, (the same worst case), continuous-drive, upper-bound power specification is estimated to produce a power of 250 mW, by assuming a 50 mA writing current. Unlike purely semiconductor dynamic and static random access memories, because this proposed device is non-volatile, no standby power is needed to maintain data integrity. In actual application, actual and average power consumption will be significantly lower than the worst case values described above because data are both written and read at a duty cycle significantly less than 100%.

Having thus disclosed various exemplary embodiments of the above-noted improvements, what is claimed is:

1. An improved non-volatile magnetic random access memory of the type having an array of unit cells, each cell having a Hall-effect sensor comprised of a rectangular shape of semiconductor material and a thin-film magnetic element of selected dimension, the magnetic element having a length greater than width and being made of material having an in-plane uniaxial anisotropy and in-plane bipolar remanent magnetization states along the length, the magnetic element being positioned with one end near the center of the Hall-effect sensor, means for selectively conducting a sensing current through the Hall-effect sensor from one side to an opposite side of the rectangular shape in a direction perpendicular to the length of the thin-film magnetic element, thereby producing a differential in electrical potentials on sides of the rectangular shape that are perpendicular to the sides of the semiconductor material through which current is conducted, and means for amplifying the differential in electrical potentials, whereby a signal is produced the polarity of which corresponds to the state of the bipolar remanent magnetization of the thin-film magnetic element along its length, each cell further having a conductor perpendicular to and overlaying the length of the thin-film magnetic element and means for applying a current through the conductor with a selected polarity for storing a binary digit 1 or 0 in the thin-film magnetic element, thereby setting the bipolar remanent magnetization state of the thin-film magnetic element to a selected state representative of a binary digit of 1 or 0; the improvement comprising:

a Hall-effect sensor made of a layer of semiconductor material separated from a substrate by a buffering layer of material;

wherein said layer of semiconductor material comprises a material taken from the group consisting of GaAs, InGaAs, InAs and InSb.

2. An improved non-volatile magnetic random access memory of the type having an array of unit cells, each cell having a Hall-effect sensor comprised of a rectangular shape of semiconductor material and a thin-film magnetic element of selected dimension, the magnetic element having a length greater than width and being made of material having an in-plane uniaxial anisotropy and in-plane bipolar remanent magnetization states along the length, the magnetic element being positioned with one end near the center of the Hall-effect sensor, means for selectively conducting a sensing current through the Hall-effect sensor from one side to an opposite side of the rectangular shape in a direction perpendicular to the length of the thin-film magnetic element, thereby producing a differential in electrical potentials on sides of the rectangular shape that are perpendicular to the sides of the semiconductor material through which current is conducted, and means for amplifying the differential in electrical potentials, whereby a signal is produced the polarity of which corresponds to the state of the bipolar remanent magnetization of the thin-film magnetic element along its length, each cell further having a conductor perpendicular to and overlaying the length of the thin-film magnetic element and means for applying a current through the conductor with a selected polarity for storing a binary digit 1 or 0 in the thin-film magnetic element, thereby setting the bipolar remanent magnetization state of the thin-film magnetic element to a selected state representative of a binary digit of 1 or 0; the improvement comprising:

a Hall-effect sensor made of a layer of semiconductor material separated from a substrate by a buffering layer of material;

wherein said layer of semiconductor material comprises InAs grown by molecular beam epitaxy.

3. An improved non-volatile magnetic random access memory of the type having an array of unit cells, each cell having a Hall-effect sensor comprised of a rectangular shape of semiconductor material and a thin-film magnetic element of selected dimension, the magnetic element having a length greater than width and being made of material having an in-plane uniaxial anisotropy and in-plane bipolar remanent magnetization states along the length, the magnetic element being positioned with one end near the center of the Hall-effect sensor, means for selectively conducting a sensing current through the Hall-effect sensor from one side to an opposite side of the rectangular shape in a direction perpendicular to the length of the thin-film magnetic element, thereby producing a differential in electrical potentials on sides of the rectangular shape that are perpendicular to the sides of the semiconductor material through which current is conducted, and means for amplifying the differential in electrical potentials, whereby a signal is produced the polarity of which corresponds to the state of the bipolar remanent magnetization of the thin-film magnetic element along its length, each cell further having a conductor perpendicular to and overlaying the length of the thin-film magnetic element and means for applying a current through the conductor with a selected polarity for storing a binary digit 1 or 0 in the thin-film magnetic element, thereby setting the bipolar remanent magnetization state of the thin-film magnetic element to a selected state representative of a binary digit of 1 or 0;

wherein said array is a rectangular array having a plurality of columns of said unit cells and a plurality of rows of said unit cells, and wherein said differential in electrical potentials on the sides of said rectangular shape of semiconductor material of each Hall-effect sensor in a column is connected in series with all other differentials of electrical potentials of Hall-effect sensors of the same column, and said series connection of differentials in electrical potentials for a single column is connected to said amplifying means while said means for selectively conducting a sensing current is conducting sensing current in only one unit cell of said column connected in series;

said array including a single data bit output terminal for all columns of said array, and wherein said means for selectively conducting a sensing current through said semiconductor material from one side to an opposite side of every unit cell in a row of said rectangular array is comprised of a conductive path through each unit cell of a row, means for on and off switching control of current through said each conductive path to select a row of said array for read out, and means for selectively enabling differentials in electrical potentials in series of a single column to be amplified and presented at said single data bit output terminal; and wherein said means for selecting the polarity of current through said conductor perpendicular to said length of said thin-film magnetic element of each unit cell of said array comprises a source of current, switching means for each column of unit cells for selectively turning on said current source for a selected column of unit cells and selecting the polarity of said current to said selected column of unit cells, and a separate switch for selectively connecting said current source to a unit cell of a selected row in said selected column; the improvement comprising:

conductive means associated with each said path of each said Hall-effect sensor in said array for isolating each such sensor from all other sensors in said array.

4. The improvement recited in claim 3 wherein said means for isolating comprises at least one switch transistor connected in series with each said conductive path and each said Hall-effect sensor.

5. An improved non-volatile magnetic random access memory of the type having an array of unit cells, each cell having a Hall-effect sensor comprised of a rectangular shape of semiconductor material and a thin-film magnetic element of selected dimension, the magnetic element having a length greater than width and being made of material having an in-plane uniaxial anisotropy and in-plane bipolar remanent magnetization states along the length, the magnetic element being positioned with one end near the center of the Hall-effect sensor, means for selectively conducting a sensing current through the Hall-effect sensor from one side to an opposite side of the rectangular shape in a direction perpendicular to the length of the thin-film magnetic element, thereby producing a differential in electrical potentials on sides of the rectangular shape that are perpendicular to the sides of the semiconductor material through which current is conducted, and means for amplifying the differential in electrical potentials, whereby a signal is produced the polarity of which corresponds to the state of the bipolar remanent magnetization of the thin-film magnetic element along its length, each cell further having a conductor perpendicular to and overlaying the length of the thin-film magnetic element and means for applying a current through the conductor with a selected polarity for storing a binary digit 1 or 0 in the thin-film magnetic element, thereby setting the bipolar remanent magnetization state of the thin-film magnetic element to a selected state representative of a binary digit of 1 or 0; the improvement comprising:

means associated with said magnetic element overlying conducting for reducing the current through said conductor required for storing a binary digit in said magnetic element;

wherein said current-reducing means comprises a picture-frame-like conductor.

6. An improved non-volatile magnetic random access memory of the type having an array of unit cells, each cell having a Hall-effect sensor comprised of a rectangular shape of semiconductor material and a thin-film magnetic element of selected dimension, the magnetic element having a length greater than width and being made of material having an in-plane uniaxial anisotropy and in-plane bipolar remanent magnetization states along the length, the magnetic element being positioned with one end near the center of the Hall-effect sensor, means for selectively conducting a sensing current through the Hall-effect sensor from one side to an opposite side of the rectangular shape in a direction perpendicular to the length of the thin-film magnetic element, thereby producing a differential in electrical potentials on sides of the rectangular shape that are perpendicular to the sides of the semiconductor material through which current is conducted, and means for amplifying the differential in electrical potentials, whereby a signal is produced the polarity of which corresponds to the state of the bipolar remanent magnetization of the thin-film magnetic element along its length, each cell further having a conductor perpendicular to and overlaying the length of the thin-film magnetic element and means for applying a current through the conductor with a selected polarity for storing a binary digit 1 or 0 in the thin-film magnetic element, thereby setting the bipolar remanent magnetization state of the thin-film magnetic element to a selected state representative of a binary digit of 1 or 0; the improvement comprising:

means associated with said magnetic element overlying conductor for reducing the current through said conductor required for storing a binary digit in said magnetic element;

wherein said current-reducing means comprises top and bottom conductors interconnected by vias and forming a multiple-turn coil around said magnetic element.

7. An improved non-volatile magnetic random access memory of the type having an array of unit cells, each cell having a Hall-effect sensor comprised of a rectangular shape of semiconductor material and a thin-film magnetic element of selected dimension, the magnetic element having a length greater than width and being made of material having an in-plane uniaxial anisotropy and in-plane bipolar remanent magnetization states along the length, the magnetic element being positioned with one end near the center of the Hall-effect sensor, means for selectively conducting a sensing current through the Hall-effect sensor from one side to an opposite side of the rectangular shape in a direction perpendicular to the length of the thin-film magnetic element, thereby producing a differential in electrical potentials on sides of the rectangular shape that are perpendicular to the sides of the semiconductor material through which current is conducted, and means for amplifying the differential in electrical potentials, whereby a signal is produced the polarity of which corresponds to the state of the bipolar remanent magnetization of the thin-film magnetic element along its length, each cell further having a conductor perpendicular to and overlaying the length of the thin-film magnetic element and means for applying a current through the conductor with a selected polarity for storing a binary digit 1 or 0 in the thin-film magnetic element, thereby setting the bipolar remanent magnetization state of the thin-film magnetic element to a selected state representative of a binary digit of 1 or 0; the improvement comprising:

a semiconductor material that is GaAs;

wherein each such unit cell has associated with it at least one switching transistor for selectively storing a binary digit in said magnetic element and at least switching transistor for selectively sensing the state of said binary digit; each such transistor comprising GaAs.

8. The improvement recited in claim 7 wherein each such transistor comprises a metal-oxide-semiconductor field-effect transistor.

9. The improvement recited in claim 7 wherein each said Hall-effect sensor and each said transistor are implemented using the same GaAs material layer.

10. The improvement recited in claim 7 wherein each such transistor comprises an epitaxial GaAs layer grown on a semi-insulating GaAs substrate, and wherein each such transistor comprises source and drain ohmic contacts and a gate formed by a Schottky barrier contact.

11. A non-volatile random access memory comprising:

a plurality of memory modules combined to form a three-dimensional memory module stack, each such module being attached to an adjacent module by an adhesive and being separated therefrom by a heat sink, each such module comprising a unitary integrated circuit chip having its own external connection leads;

wherein each such module comprises a non-volatile magnetic Hall-effect random access memory.

12. An improved non-volatile magnetic random access memory of the type having an array of unit cells, each cell having a Hall-effect sensor comprised of a rectangular shape of semiconductor material on a thin-film magnetic element of selected dimension, the magnetic element having a length greater than width and being made of material having an in-plane uniaxial anisotropy and in-plane bipolar remanent magnetization states along the length, the magnetic element being positioned with one end near the center of the Hall-effect sensor, means for selectively conducting a sensing current through the Hall-effect sensor from one side to an opposite side of the rectangular shape in a direction perpendicular to the length of the thin-film magnetic element, thereby producing a differential in electrical potentials on sides of the rectangular shape that are perpendicular to the sides of the semiconductor material through which current is conducted, and means for amplifying the differential in electrical potentials, whereby a signal is produced the polarity of which corresponds to the state of the bipolar remanent magnetization of the thin-film magnetic element along its length, each cell further having a conductor perpendicular to and overlaying the length of the thin-film magnetic element and means for applying a current through the conductor with a selected polarity for storing a binary digit 1 or 0 in the thin-film magnetic element, thereby setting the bipolar remanent magnetization state of the thin-film magnetic element to a selected state representative of a binary digit of 1 or 0; the improvement comprising:

the improvement wherein said thin film magnetic element comprises a material taken from the group consisting of NiFe, $\gamma$-$Fe_2O_3$, CoPt, CoPtO and other alloys of cobalt;

wherein said Hall-effect sensor is made of semiconductor material separated from a substrate by a buffering layer;

wherein said buffering layer comprises material taken from the group consisting of GaAs, AlAs, AlGaAs and InAlAs.

* * * * *